United States Patent
Bani Shamseh et al.

(10) Patent No.: US 12,140,613 B2
(45) Date of Patent: Nov. 12, 2024

(54) OPEN-PHASE DETECTION CIRCUIT AND POWER CONVERSION APPARATUS

(71) Applicant: TMEIC Corporation, Chuo-ku (JP)

(72) Inventors: Mohammad Bani Shamseh, Tokyo (JP); Yoshihiro Tawada, Tokyo (JP)

(73) Assignee: TMEIC CORPORATION, Chuo-ku (JP)

( * ) Notice: Subject to any disclaimer, the term of this patent is extended or adjusted under 35 U.S.C. 154(b) by 383 days.

(21) Appl. No.: 17/754,459

(22) PCT Filed: Nov. 5, 2019

(86) PCT No.: PCT/JP2019/043328
§ 371 (c)(1),
(2) Date: Apr. 1, 2022

(87) PCT Pub. No.: WO2021/090370
PCT Pub. Date: May 14, 2021

(65) Prior Publication Data
US 2022/0334151 A1    Oct. 20, 2022

(51) Int. Cl.
*G01R 19/04*    (2006.01)
*H02M 1/00*    (2007.01)
*H02M 7/537*    (2006.01)

(52) U.S. Cl.
CPC .......... *G01R 19/04* (2013.01); *H02M 1/0009* (2021.05); *H02M 7/537* (2013.01)

(58) Field of Classification Search
CPC ........ G01R 19/04; G01R 31/58; G01R 31/54; H02M 1/0009; H02M 7/537; H02M 1/32; H02H 3/34
See application file for complete search history.

(56) References Cited

U.S. PATENT DOCUMENTS

2015/0177335 A1    6/2015    Halt et al.
2016/0211771 A1*   7/2016    Ichihara .................. H02M 1/08
(Continued)

FOREIGN PATENT DOCUMENTS

JP           50-4857        2/1975
JP           2004-187435 A  7/2004
WO           WO-2018066070 A1 *  4/2018   .............. H02M 7/48

OTHER PUBLICATIONS

English translation of WO-2018066070-A1 (Year: 2018).*
(Continued)

*Primary Examiner* — Thang X Le
*Assistant Examiner* — Haidong Zhang
(74) *Attorney, Agent, or Firm* — Oblon, McClelland, Maier & Neustadt, L.L.P.

(57) ABSTRACT

A power conversion apparatus includes a power conversion circuit configured to convert DC power into three-phase AC power; and a control device configured to generate a two-phase negative-phase current from a three-phase AC current output from the power conversion circuit, and to detect an open phase on an output side of the power conversion circuit based on a magnitude of an amplitude of the two-phase negative-phase current. The control device may be configured to determine an occurrence of the open phase when the magnitude of the amplitude of the two-phase negative-phase current increases, and an electric current of at least one phase of the three-phase AC current decreases.

6 Claims, 5 Drawing Sheets

(56) References Cited

U.S. PATENT DOCUMENTS

2016/0308464 A1* 10/2016 Inzunza Figueroa ... H02J 3/381
2017/0063252 A1*  3/2017 Fukumaru ........... H02M 7/5387
2018/0191238 A1*  7/2018 Tsuchiya ................ H02M 1/32

OTHER PUBLICATIONS

Indian Office Action issued Mar. 18, 2024 in Indian Application 202217019998, 2 pages.
Indian Office Action issued Aug. 25, 2022 in Indian Patent Application No. 202217019998, 6 pages.

* cited by examiner

OPEN-PHASE DETECTION CIRCUIT AND POWER CONVERSION APPARATUS

FIELD

The present application relates to an open-phase detection circuit and a power conversion apparatus.

BACKGROUND

Conventionally, as described in JP 2004-187435 A, for example, an open-phase detection device has been known. The open-phase detection device detects an open phase based on a phase difference in voltage between three-phase polarity wires (RST) and a neutral wire N.

CITATION LIST

Patent Literature

[PTL 1] JP 2004-187435 A

SUMMARY

Technical Problem

There may be a case where the output from a power conversion apparatus decreases. An example of such a case may be a case where the output from a power supply to which the power conversion apparatus is connected decreases. Occurrence of a low output operation in the power conversion apparatus may be misunderstood as the occurrence of an open phase on the output side of the power conversion apparatus. If a simple low output operation and an open phase cannot be distinguished from each other with accuracy, there is a possibility that the occurrence of an open phase is erroneously detected. The above-mentioned conventional technique does not take such a situation into consideration and hence, there is still room for improvement.

The present application has been made to solve the above-mentioned problem, and it is an object of the present application to provide an open-phase detection circuit and a power conversion apparatus with improved accuracy in detecting an open phase.

Solution to Problem

A power conversion apparatus according to the present application includes a power conversion circuit and a control device. The power conversion circuit is configured to convert direct-current (DC) power into three-phase alternating-current (AC) power. The control device is configured to generate a two-phase negative-phase current from a three-phase AC current output from the power conversion circuit, and to detect an open phase on an output side of the power conversion circuit based on a magnitude of an amplitude of the two-phase negative-phase current.

An open-phase detection circuit according to the present application is configured to generate a two-phase negative-phase current from a three-phase AC current output from a power conversion circuit, and to detect an open phase on an output side of the power conversion circuit based on a magnitude of an amplitude of the two-phase negative-phase current.

Advantageous Effects of Invention

A simple low output operation and an open phase differ from each other in the behavior of a negative phase current. According to the present application, the negative phase current is utilized in open phase detection so that the simple low output operation and the open phase can be distinguished from each other with accuracy. Therefore, it is possible to improve accuracy in detecting an open phase.

DESCRIPTION OF EMBODIMENT

Figure 1:
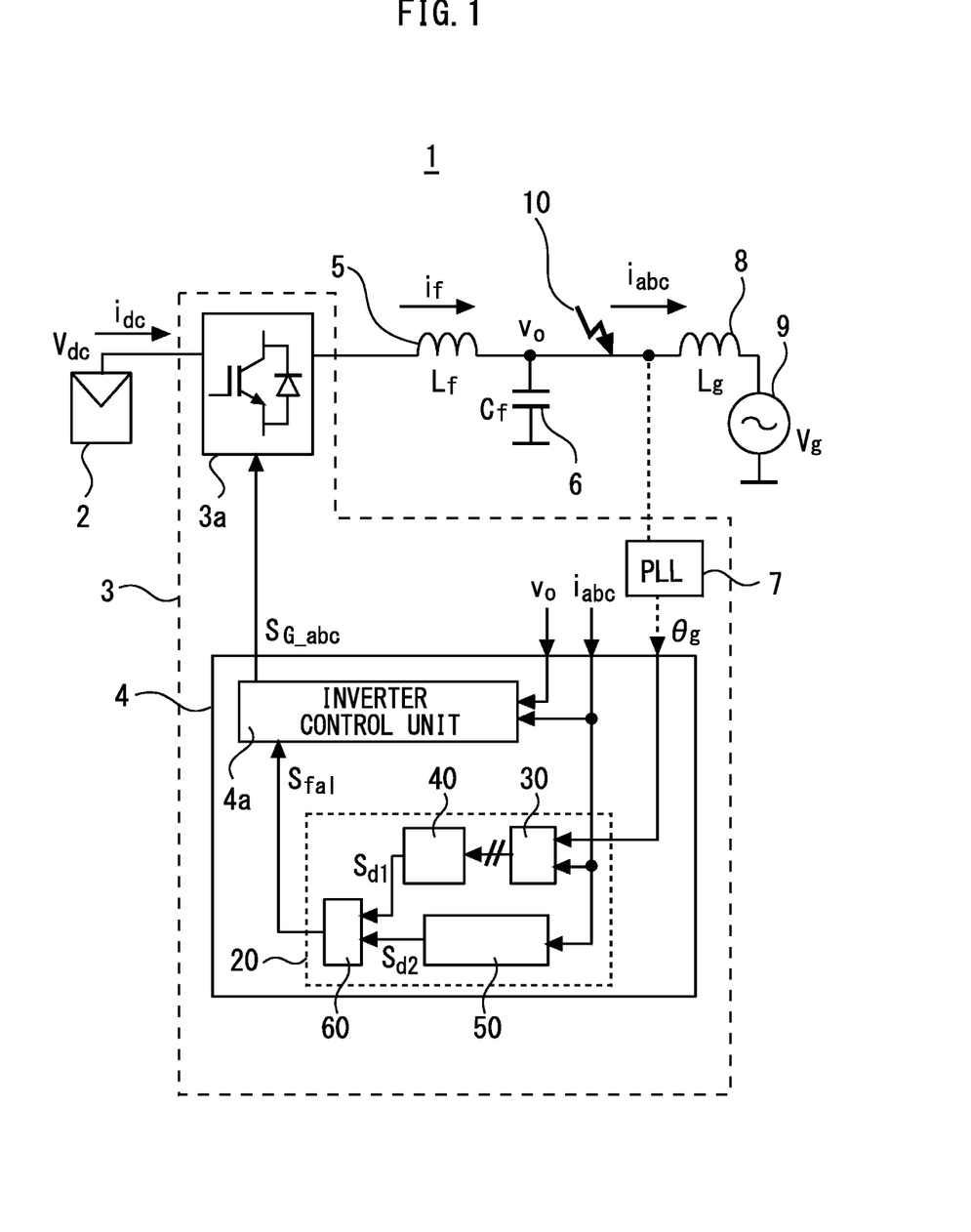
FIG. 1 is a diagram showing the configuration of a power conversion apparatus according to an embodiment and an interconnection power system provided with the power conversion apparatus.

FIG. 1 is a diagram showing the configuration of a power conversion apparatus 3 according to an embodiment and an interconnection power system 1 provided with the power conversion apparatus 3. As shown in FIG. 1, the interconnection power system 1 includes a DC power supply 2, the power conversion apparatus 3, a filter reactor 5, a filter capacitor 6, and an interconnection reactor 8. The interconnection power system 1 is interconnected with a power system 9.

The DC power supply 2 outputs DC power consisting of a DC voltage $V_{dc}$ and a DC current $i_{dc}$. The power conversion apparatus 3 converts the DC power from the DC power supply 2 into three-phase AC power. The power conversion apparatus 3 is also referred to as a power conditioner system (PCS). The power conversion apparatus 3 includes a power conversion circuit 3a, a control device 4, and a PLL circuit 7.

The power conversion circuit 3a is a three-phase voltage inverter circuit which outputs a three-phase AC output current $i_{abc}$ and a three-phase AC output voltage $v_o$. The relationship between abc phases and uvw phases will be described as follows. In the present embodiment, it is assumed that an "a" phase corresponds to a "u" phase, a "b" phase corresponds to a "v" phase, and a "c" phase corresponds to a "w" phase.

The power conversion circuit 3a is composed of a plurality of semiconductor switching devices, such as IGBTs or MOSFETs. The power conversion circuit 3a is configured to convert DC power into three-phase AC power in response to a switching control signal $S_{G\_abc}$. It is sufficient for the power conversion circuit 3a to be composed of any of known various three-phase inverter circuits so that the detailed description of the power conversion circuit 3a is omitted.

The control device 4 is configured to output the switching control signal $S_{G\_abc}$ based on the three-phase AC output current $i_{abc}$ output from the power conversion circuit 3a, the three-phase AC output voltage $v_o$, and a phase signal $\theta_g$ from the PLL circuit 7. The switching control signal $S_{G\_abc}$ is a gate drive signal which drives each of the semiconductor switching devices of the power conversion circuit 3a.

The PLL circuit 7 outputs the phase signal $\theta_g$. The phase signal $\theta_g$ is a signal for detecting a phase difference between the phase signal $\theta_g$ and a frequency signal which is the reference to perform phase synchronization. The phase signal $\theta_g$ is a positive phase signal $\theta_g$. A negative-phase signal ($-\theta_g$) which is an opposite phase of the positive phase signal $\theta_g$ can also be obtained from the output from the PLL circuit 7.

One end of the filter reactor 5 is connected to the output end of the power conversion apparatus 3. The filter reactor 5 has an inductance Lf. One end of the filter capacitor 6 is connected to the other end of the filter reactor 5, and the other end of the filter capacitor 6 is connected to a reference potential, such as a ground potential. The filter capacitor 6 has a capacitance Cf.

One end of the interconnection reactor 8 is connected to a connection point between the filter reactor 5 and the filter capacitor 6. The other end of the interconnection reactor 8 is connected to the power system 9. The interconnection reactor 8 has an inductance Lg.

Although not shown in the drawing, a potential transformer (PT) is provided on the output side of the power conversion apparatus 3. The potential transformer converts (transforms) a high voltage and a large electric current of an AC circuit into a low voltage and a small electric current. The potential transformer according to the embodiment includes a current transformer (CT) which converts the three-phase AC output current $i_{abc}$, and a voltage transformer (VT) which converts the three-phase AC output voltage $v_o$. The electric current and the voltage converted by these potential transformers are input into the control device 4. The electric current and the voltage input into the control device 4 are treated as the measured value of the three-phase AC output voltage $v_o$ and the measured value of the three-phase AC output current $i_{abc}$.

It is noted that the hardware configuration in FIG. 1 merely forms one example. As a modification, an LC AC filter circuit formed of the filter reactor 5 and the filter capacitor 6 may be accommodated in the power conversion apparatus 3. Alternatively, the PLL circuit 7 may be provided outside of the power conversion apparatus 3.

One example of the interconnection power system 1 is a photovoltaic power generation system. In this case, the DC power supply 2 is solar cell array. Another example of the interconnection power system 1 may be a wind power generation system. In this case, the DC power supply 2 includes a wind power generator and an AC/DC conversion circuit (that is, an ACDC converter circuit). Various renewable energy facilities that include a photovoltaic power generation system and a wind power generation system are known, and the DC power supply 2 may be such a renewable energy facility. Another example of the interconnection power system 1 may be an energy storage system (ESS). In this case, the DC power supply 2 may be storage batteries, fuel cells or the like.

The control device 4 includes an inverter control unit 4a and an open-phase detection unit 20. The inverter control unit 4a outputs a switching control signal $S_{G\_abc}$ based on the three-phase AC output current $i_{abc}$, the three-phase AC output voltage $v_o$, and the phase signal $\theta_g$ from the PLL circuit 7. When the open-phase detection unit 20 detects an open phase 10, the open-phase detection unit 20 transmits an open-phase detection signal $S_{fal}$ to the inverter control unit 4a. When the open phase 10 is detected by the open-phase detection unit 20, the inverter control unit 4a performs a protection control, such as stopping of the operation of the power conversion circuit 3a.

In the embodiment, the interconnection power system 1 provides an open phase detection technique shown in FIG. 1 which detects the occurrence of the open phase 10. The open phase detection technique is realized by the open-phase detection unit 20 which is a circuit incorporated in the control device 4. The open-phase detection unit 20 included in the control device 4 generates a two-phase negative-phase current from a three-phase AC current output from the power conversion circuit 3a. The open-phase detection unit 20 is configured to detect an open phase on the output side of the power conversion circuit 3a based on the magnitude of the amplitude of the two-phase negative-phase current.

In the embodiment, the control device 4 is configured to determine the occurrence of an open phase when the magnitude of the amplitude of the two-phase negative-phase current increases, and an electric current of at least one phase of the three-phase AC current decreases.

Specifically, the control device 4 includes a current conversion unit 30, an amplitude detection unit 40, a current effective value detection unit 50, and a logic detection unit 60. The current conversion unit 30 converts a three-phase AC current into a two-phase negative-phase current.

The amplitude detection unit 40 calculates the amplitude of the two-phase negative-phase current according to a predetermined function (that is, expression (1) described later). The amplitude detection unit 40 outputs a first output signal $S_{d1}$ when the calculated amplitude increases to a value higher than a predetermined negative-phase current reference value.

The current effective value detection unit 50 outputs a second output signal $S_{d2}$ when at least one effective value out of a first-phase current effective value, a second-phase current effective value, and a third-phase current effective value of the three-phase AC current becomes lower than a predetermined current determination value. The logic detection unit 60 outputs an open-phase detection signal $S_{fal}$ based on an AND of the first output signal $S_{d1}$ and the second output signal $S_{d2}$.

Figure 2:
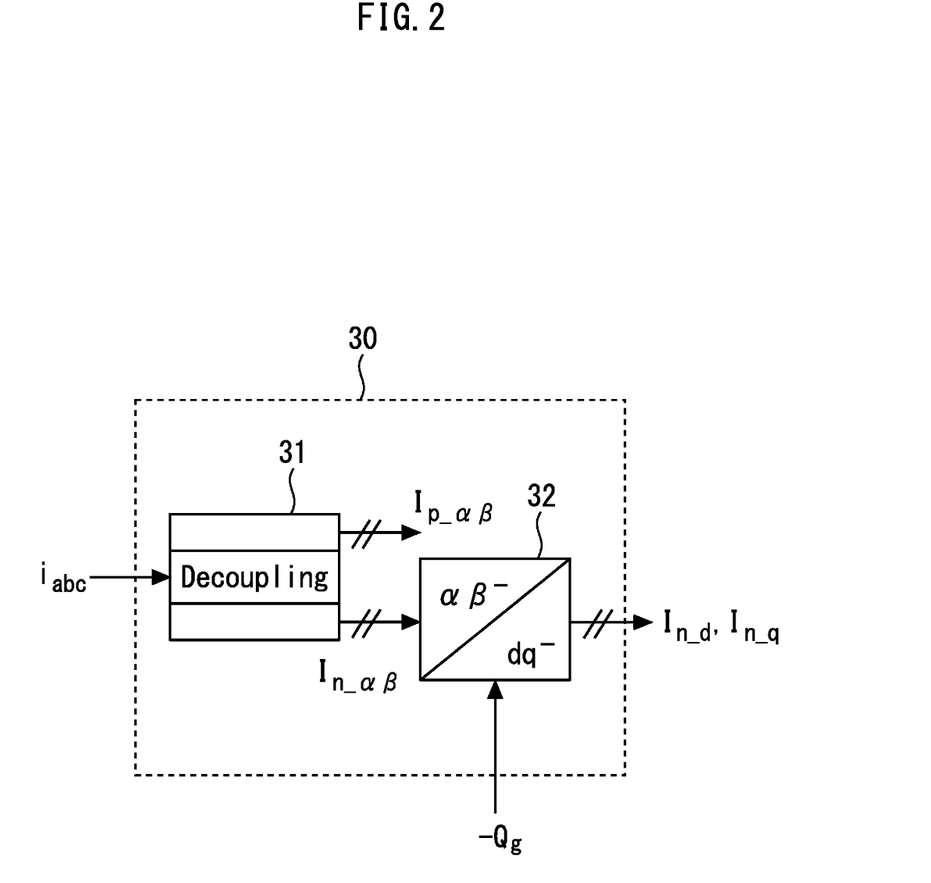
FIG. 2 is a diagram showing the configuration of a current conversion unit included in the power conversion apparatus according to the embodiment.

FIG. 2 is a diagram showing the configuration of the current conversion unit 30 included in the power conversion apparatus 3 according to the embodiment. The current conversion unit 30 outputs Positive-phase sequence components and Negative-phase sequence components of the three-phase AC current $i_{abc}$. The current conversion unit 30 includes a decoupling unit 31 and a dq conversion unit 32.

The decoupling unit 31 performs αβ conversion on the three-phase AC current $i_{abc}$ to generate a two-phase positive-phase current $I_{p\_\alpha\beta}$ and a two-phase negative-phase current $I_{n\_\alpha\beta}$. The two-phase positive-phase current $I_{p\_\alpha\beta}$ includes $I_{p\_\alpha}$ and $I_{p\_\beta}$. The two-phase negative-phase current $I_{n\_\alpha\beta}$ includes $I_{n\_\alpha}$ and $I_{n\_\beta}$.

The dq conversion unit 32 performs dq conversion on the two-phase negative-phase current $I_{n\_\alpha\beta}$ to generate a two-phase negative-phase current $I_{n\_dq}$. The two-phase negative-phase current $I_{n\_dq}$ includes $I_{n\_d}$ which is a d-axis component and $I_{n\_q}$ which is a q-axis component.

The two-phase positive-phase current $I_{p\_\alpha\beta}$ may also be converted into a two-phase positive-phase current $I_{p\_dq}$ via another dq conversion unit not shown in the drawing. The above-mentioned three-phase/two-phase conversion technique, αβ conversion technique, and dq conversion technique are already known in the technical field of the present application, and is not a new matter and hence, the detailed description is omitted.

Figure 3:
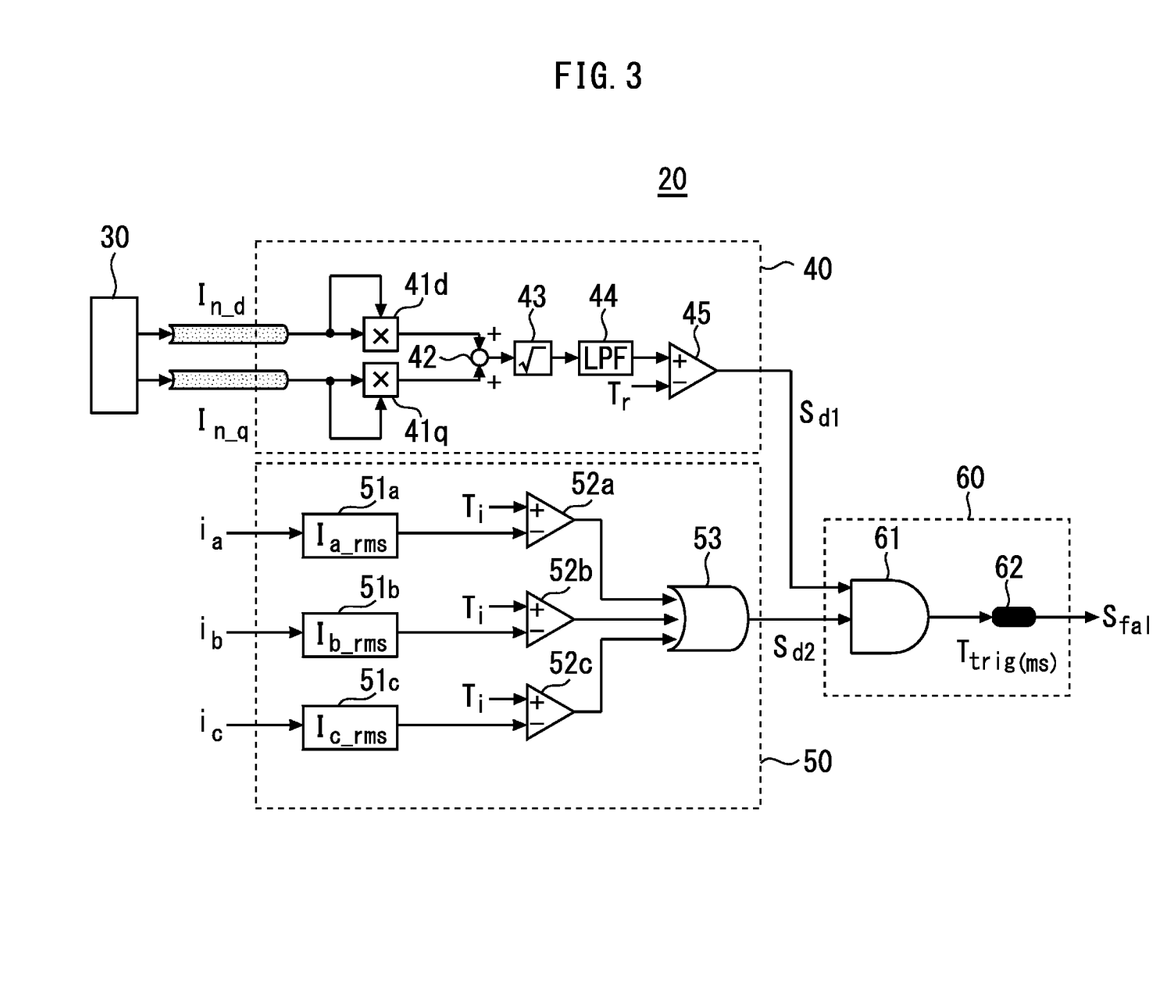
FIG. 3 is a diagram showing the configuration of an open-phase detection unit which is an open-phase detection circuit included in the power conversion apparatus according to the embodiment.

FIG. 3 is a diagram showing the configuration of the open-phase detection unit 20, which is an open-phase detection circuit included in the power conversion apparatus 3 according to the embodiment. The amplitude detection unit 40 includes a first integration unit 41$d$, a second integration unit 41$q$, an adder 42, a square root calculation unit 43, a low-pass filter 44, and an amplitude detection comparator 45.

The first integration unit 41$d$ outputs the square value of a d-axis negative-phase current value $I_{n\_d}$. The second integration unit 41$q$ outputs the square value of a q-axis negative-phase current value $I_{n\_q}$. The adder 42 adds the output value of the first integration unit 41$d$ and the output value of the second integration unit 41$q$. The square root calculation unit 43 calculates the square root of the output value of the adder 42.

The calculation of the following mathematical expression (1) is performed by the first integration unit 41$d$, the second integration unit 41$q$, the adder 42, and the square root calculation unit 43. The amplitude $I_{n\_abs}$ of a two-phase negative-phase current is calculated according to the expression (1). The amplitude detection unit 40 has a function of calculating the mathematical expression (1) as a predetermined function.

[Math. 1]

$$I_{n\_abs} = \sqrt{(I_{n\_d}) + (I_{n\_q})^2} \quad (1)$$

The low-pass filter 44 is connected to the output side of the square root calculation unit 43. The low-pass filter 44 performs filtering on an output signal from the square root calculation unit 43 such that components of equal to or less than a predetermined frequency are allowed to pass through the low-pass filter 44.

The amplitude detection comparator 45 switches the first output signal $S_{d1}$ to a high level when the output signal from the low-pass filter 44 exceeds a predetermined negative-phase current reference value $T_r$. The negative-phase current reference value $T_r$ may be several % of the rated current of the power conversion apparatus 3, for example, and may be approximately 1.5% of the rated current, for example.

The current effective value detection unit 50 includes a first effective value calculation unit 51$a$, a second effective value calculation unit 51$b$, a third effective value calculation unit 51$c$, a first effective value comparator 52$a$, a second effective value comparator 52$b$, a third effective value comparator 52$c$, and an OR circuit 53.

The first effective value calculation unit 51$a$ calculates a first-phase current effective value $i_{a\_rms}$ from a first-phase current $i_a$. The second effective value calculation unit 51$b$ calculates a second-phase current effective value $i_{b\_rms}$ from a second-phase current $i_b$. The third effective value calculation unit 51$c$ calculates a third-phase current effective value $i_{c\_rms}$ from a third-phase current $i_c$.

The first effective value comparator 52$a$ switches an output signal to a high level when the first-phase current effective value $i_{a\_rms}$ becomes lower than the predetermined current determination value $T_i$. The second effective value comparator 52$b$ switches an output signal to a high level when the second-phase current effective value $i_{b\_rms}$ becomes lower than the predetermined current determination value $T_i$. The third effective value comparator 52$c$ switches an output signal to a high level when the third-phase current effective value $i_{c\_rms}$ becomes lower than the predetermined current determination value $T_i$.

The OR circuit 53 receives the output signal from the first effective value comparator 52$a$, the output signal from the second effective value comparator 52$b$, and the output signal from the third effective value comparator 52$c$, and the OR circuit 53 calculates the OR of these three output signals. The OR circuit 53 calculates the OR so that when at least one of the three output signals is a high signal, the OR circuit 53 outputs a high signal.

The current determination value $T_i$ may be, for example, less than 1% of the rated current of the power conversion apparatus 3 or may be approximately 0.1% to approximately 0.9% of the rated current and, specifically, may be approximately 0.1% of the rated current. In the embodiment, as an example, the current determination value $T_i$ is set smaller than the negative-phase current reference value $T_r$ ($T_r > T_i$). More specifically, as an example, the current determination value $T_i$ is set to a value smaller than the negative-phase current reference value $T_r$ by an order of magnitude.

The logic detection unit 60 includes an AND circuit 61 and an on-delay unit 62. The AND circuit 61 calculates the AND of the first output signal $S_{d1}$ and the second output signal $S_{d2}$. The AND circuit 61 calculates the AND so that the AND circuit 61 outputs a high signal only when both of the first output signal $S_{d1}$ and the second output signal $S_{d2}$ are high signals.

The on-delay unit 62 performs on-delay of a predetermined delay time $T_{trig}$ on the output signal from the AND circuit 61. The delay time of the on-delay unit 62 may be 10 ms (milliseconds), for example. The on-delay unit 62 can remove noises.

FIG. 3 shows, as an example, a circuit block where constitutional elements of the open-phase detection unit 20 include logic gates and comparators. However, the open-phase detection unit 20 may be composed of any one of an analog circuit, a digital circuit, or a digital-analog mixed circuit. The function of performing an arithmetic operation for the open-phase detection unit 20 may be suitably selected from various functions of any form, such as a mathematical expression, table or map.

Figure 4:
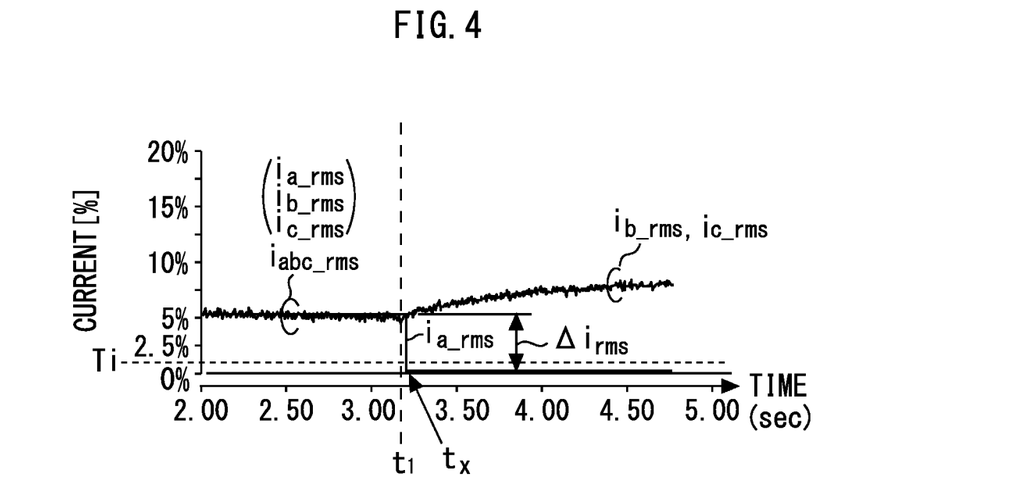
FIG. 4 is a graph for describing the effectiveness of detecting an open phase of the power conversion apparatus according to the embodiment.
Figure 5:
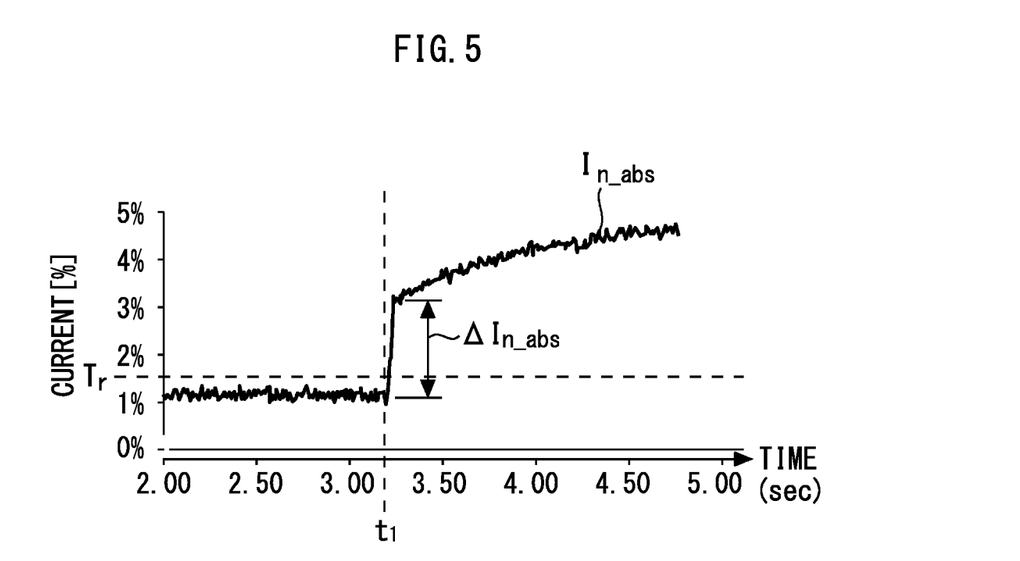
FIG. 5 is a graph for describing the effectiveness of detecting an open phase of the power conversion apparatus according to the embodiment.

FIG. 4 and FIG. 5 are graphs for describing the effectiveness of detecting an open phase of the power conversion apparatus 3 according to the embodiment. When an open phase occurs at a time $t_1$, the value of the first-phase current effective value $i_{a\_rms}$ suddenly changes at a time $t_x$ which is a time immediately after the time $t_1$ in FIG. 4. Specifically, the first-phase current effective value $i_{a\_rms}$ sharply decreases at the time $t_x$. A decrease amount is $\Delta i_{rms}$, and has a magnitude of approximately 5% of the rated current, for example.

Further, in FIG. 5, immediately after the time $t_1$, the amplitude $I_{n\_abs}$ of the negative phase current suddenly changes. Specifically, the amplitude $I_{n\_abs}$ sharply increases. An increase amount is $\Delta I_{n\_abs}$, and has a magnitude of approximately 2% of the rated current, for example.

Figure 6:
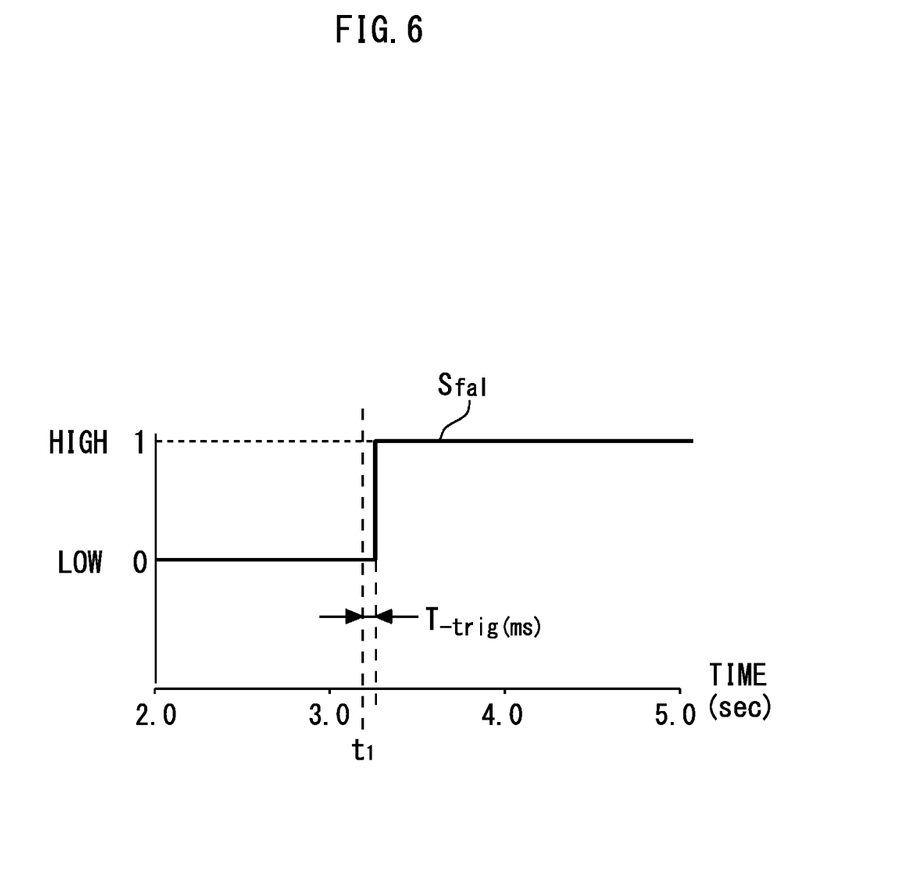
FIG. 6 is a timing chart for describing the operation of the power conversion apparatus according to the embodiment.

FIG. 6 is a timing chart for describing the operation of the power conversion apparatus 3 according to the embodiment. In FIG. 6, the open-phase detection signal $S_{fal}$ rises to a high level after a lapse of a delay time $T_{trig}$ from the time $t_1$.

A simple low output operation and an open phase differ from each other in the behavior of the negative phase current. In the case of the simple low output operation, the output current value of each of three phases has substantially the same low value.

The description "simple low output operation" means a case where there is no occurrence of an open phase, and the output from the power conversion apparatus 3 happens to be low. One example of the simple low output operation is as follows. In the case of a power conversion apparatus connected to a photovoltaic power generation system, a quantity of solar radiation is small in the early morning or in the evening so that the power conversion apparatus has a low output. In a renewable energy power generation facility where the amount of power generation varies depending on weather, a simple low output operation may occur depending on weather for the same reason as the photovoltaic power generation system. The renewable energy power generation facility of this type includes a wind power generation facility and the like. Another example of the simple low output operation is as follows. In an energy storage system (ESS) including storage batteries, when power stored in the storage batteries decrease, the output from the power conversion apparatus may decrease.

Whereas, when an open phase occurs, output voltages and output currents of three phases become unbalanced. This unbalance appears in the form of an increase in negative phase current. In view of the above, by utilizing a negative phase current in open phase detection, a simple low output operation and an open phase can be distinguished from each other with accuracy. Therefore, it is possible to improve accuracy in detecting an open phase.

Particularly, according to the embodiment, it is possible to improve both accuracy in detecting an open phase and a speed of detecting an open phase. Improvement of the speed of detecting an open phase is also a unique advantageous effect achieved by arithmetic processing performed by a control block shown in FIG. 4.

As a modification, the current effective value detection unit 50 and the AND circuit 61 may be omitted from the open-phase detection unit 20. Hereinafter, the modification will be described.

When an open phase occurs in a phase, the output current of that phase becomes zero. Whereas, unbalanced output currents of three phases may occur for a reason which is not an open phase but an unbalanced relative voltage due to some cause. In this case, output currents of any one or two phases of three phases may decrease to around 50% to 60% of the rated current, for example, due to unbalanced relative voltage.

In the embodiment, the current effective value detection unit 50 in FIG. 3 performs comparison determination based on the current determination value $T_i$. Therefore, in the embodiment, the presence of a phase where an output current remarkably decreases is detected so that the presence or absence of an open phase can be more strictly detected. Accordingly, in the embodiment, an unbalance and an open phase can be distinguished from each other with high accuracy.

However, in the case where the current effective value detection unit 50 is omitted for the modification, the comparison determination cannot be performed based on the current determination value $T_i$. Therefore, in this modification, the negative-phase current reference value $T_r$ in FIG. 5 may be set as follows. The larger the current effective value decrease amount $\Delta i_{rms}$ shown in FIG. 4 becomes, the larger the negative phase current amplitude increase amount $\Delta I_{n\_abs}$ shown in FIG. 5 becomes. To output an open-phase detection signal $S_{fal}$ only when the negative phase current amplitude increase amount $\Delta I_{n\_abs}$ sufficiently increases, the negative-phase current reference value $T_r$ in FIG. 5 may be set to a relatively large value.

The negative-phase current reference value $T_r$ is set to a relatively large value so that it is possible to output an open-phase detection signal $S_{fal}$ only when an output current of a specific phase significantly decreases due to an open phase. Whereas, an open phase is not detected when the negative phase current amplitude increase amount $\Delta I_{n\_abs}$ is not relatively large and hence, it is also possible to prevent erroneous detection of an open phase. For example, as one of the modifications, the negative-phase current reference value $T_r$ may be set to 2% to 3% of the rated current by taking into account FIG. 5.

The open phase technique according to the embodiment may be provided as a "method for detecting an open phase." In the method for detecting an open phase according to the embodiment, a two-phase negative-phase current is generated from a three-phase AC current output from the power conversion circuit, and an open phase on the output side of the power conversion circuit is detected based on the magnitude of the amplitude of the two-phase negative-phase current.

In the above-mentioned method for detecting an open phase according to the embodiment, the occurrence of an open phase may be determined when the magnitude of the amplitude of a two-phase negative-phase current increases, and an electric current of at least one phase of a three-phase AC current decreases.

The above-mentioned method for detecting an open phase according to the embodiment may include: a step of converting a three-phase AC current into a two-phase negative-phase current; a step of calculating the amplitude of the two-phase negative-phase current according to a predetermined function, and detecting an increase of the amplitude to a value more than a predetermined negative-phase current reference value; a step of detecting that at least one effective value out of a first-phase current effective value, a second-phase current effective value and a third-phase current effective value of the three-phase AC current becomes lower than a predetermined current determination value; and a step of detecting an open phase when the amplitude increases to the value more than the predetermined negative-phase current reference value and at least one effective value becomes lower than the predetermined current determination value.

REFERENCE SIGNS LIST 1 interconnection power system
2 DC power supply
3 power conversion apparatus
3a power conversion circuit
4 control device
4a inverter control unit
5 filter reactor
6 filter capacitor
7 PLL circuit
8 interconnection reactor
9 power system
10 open phase
20 open-phase detection unit
30 current conversion unit
31 decoupling unit
32 dq conversion unit
40 amplitude detection unit
41d first integration unit
41q second integration unit
42 adder
43 square root calculation unit
44 low-pass filter
45 amplitude detection comparator
50 current effective value detection unit 51a first effective value calculation unit
51b second effective value calculation unit
51c third effective value calculation unit
52a first effective value comparator
52b second effective value comparator
52c third effective value comparator
53 OR circuit
60 logic detection unit
61 AND circuit
62 on-delay unit
Cf capacitance
$i_{abc}$ three-phase AC current (three-phase AC output current)
$i_a$ first-phase current
$i_{a\_rms}$ first-phase current effective value
$i_b$ second-phase current
$i_{b\_rms}$ second-phase current effective value
$i_c$ third-phase current
$i_{c\_rms}$ third-phase current effective value
$i_{dc}$ DC current
$I_{n\_abs}$ amplitude
$I_{n\_d}$ d-axis negative-phase current value
$I_{n\_dq}$ two-phase negative-phase current (dq axis)
$I_{n\_\alpha\beta}$ two-phase negative-phase current ($\alpha\beta$ axis)
$I_{p\_dq}$ two-phase positive-phase current (dq axis)
$I_{p\_\alpha\beta}$ two-phase positive-phase current ($\alpha\beta$ axis)
Lf, Lg inductance
$S_{d1}$ first output signal
$S_{d2}$ second output signal
$S_{fal}$ open-phase detection signal
$S_{G\_abc}$ switching control signal
$t_1$ time (open phase occurrence time)
$T_i$ current determination value
$T_r$ negative-phase current reference value
$T_{trig}$ delay time
$V_{dc}$ DC voltage
$v_o$ three-phase AC output voltage
$\Delta I_{n\_abs}$ negative phase current amplitude increase amount
$\Delta i_{rms}$ current effective value decrease amount
$\theta_g$ phase signal

The invention claimed is:

1. A power conversion apparatus comprising:
a power conversion circuit configured to convert direct-current power into three-phase alternating-current power; and
a control device configured to generate a two-phase negative-phase current from a three-phase alternating current outputted from the power conversion circuit, and to detect an open phase on an output side of the power conversion circuit based on a magnitude of an amplitude of the two-phase negative-phase current, wherein
the control device includes:
a current conversion unit configured to convert the three-phase alternating current into the two-phase negative-phase current;
an amplitude detection unit configured to calculate the amplitude of the two-phase negative-phase current according to a predetermined function, and to output a first output signal in a case that the amplitude increases to a value more than a predetermined negative-phase current reference value;
a current effective value detection unit configured to output a second output signal in a case that at least one effective value out of a first-phase current effective value, a second-phase current effective value, and a third-phase current effective value of the three-phase alternating current becomes lower than a predetermined current determination value; and
a logic detection unit configured to output an open-phase detection signal based on an AND of the first output signal and the second output signal.

2. The power conversion apparatus according to claim 1, wherein the current determination value is set smaller than the negative-phase current reference value.

3. The power conversion apparatus according to claim 2, wherein the current determination value is set to a value smaller than the negative-phase current reference value by an order of magnitude.

4. The power conversion apparatus according to claim 1, wherein the current determination value is set to a value less than 1% of a rated current of the power conversion apparatus.

5. The power conversion apparatus according to claim 1, wherein the power conversion circuit receives the direct-current power from an energy storage system or a renewable energy power generation facility, and
the control device determines that a normal low output operation is performed in a case that all of the first-phase current effective value, the second-phase current effective value, and the third-phase current effective value become lower than the current determination value.

6. The power conversion apparatus according to claim 1, wherein
the amplitude detection unit includes:
a first integrator configured to output a square value of a d-axis negative phase current of the two-phase negative-phase current;
a second integrator configured to output a square value of a q-axis negative phase current of the two-phase negative-phase current;
an adder configured to add an output value of the first integrator and an output value of the second integrator;
a square root calculation unit configured to calculate the amplitude of the two-phase negative-phase current by calculating a square root of an output value of the adder;
a low-pass filter configured to perform filtering on an output signal from the square root calculation unit such that a signal of equal to or less than a predetermined frequency is selectively allowed to pass through the low-pass filter; and
an amplitude detection comparator configured to output the first output signal in a case that an output value of the low-pass filter exceeds the negative-phase current reference value,
the current effective value detection unit includes:
a calculation unit configured to calculate the first-phase current effective value, the second-phase current effective value, and the third-phase current effective value based on the three-phase alternating current;
a first effective value comparator configured to switch an output in a case that the first-phase current effective value becomes lower than the current determination value;
a second effective value comparator configured to switch an output in a case that the second-phase current effective value becomes lower than the current determination value;

a third effective value comparator configured to switch an output in a case that the third-phase current effective value becomes lower than the current determination value; and an OR circuit configured to calculate an OR of an output signal from the first effective value comparator, an output signal from the second effective value comparator, and an output signal from the third effective value comparator to generate the second output signal, and the logic detection unit includes:

an AND circuit configured to calculate an AND of the first output signal from the amplitude detection comparator and the second output signal from the OR circuit; and an on-delay unit configured to perform on-delay of a predetermined delay time on an output from the AND circuit.

* * * * *